(12) United States Patent
Choi et al.

(10) Patent No.: US 12,651,888 B2
(45) Date of Patent: Jun. 9, 2026

(54) LASER DIODE, OPTICAL INTEGRATED DEVICE, AND MANUFACTURING METHOD THEREOF

(71) Applicant: Kyungpook National University Industry—Academic Cooperation Foundation, Buk-Gu (KR)

(72) Inventors: Muhan Choi, Daegu (KR); Inbo Kim, Seoul (KR); Hongsik Park, Daegu (KR)

(73) Assignee: Kyungpook National University Industry—Academic Cooperation Foundation, Daegu (KR)

( * ) Notice: Subject to any disclaimer, the term of this patent is extended or adjusted under 35 U.S.C. 154(b) by 1188 days.

(21) Appl. No.: 17/625,893

(22) PCT Filed: Jul. 9, 2020

(86) PCT No.: PCT/KR2020/009002
§ 371 (c)(1),
(2) Date: Jul. 22, 2022

(87) PCT Pub. No.: WO2021/006657
PCT Pub. Date: Jan. 14, 2021

(65) Prior Publication Data
US 2023/0198226 A1 Jun. 22, 2023

(30) Foreign Application Priority Data
Jul. 10, 2019 (KR) ........................ 10-2019-0083024

(51) Int. Cl.
*H01S 5/10* (2021.01)
*H01S 5/026* (2006.01)
(Continued)

(52) U.S. Cl.
CPC .......... *H01S 5/06236* (2013.01); *H01S 5/026* (2013.01); *H01S 5/1075* (2013.01); *H01S 5/4025* (2013.01); *H01S 2301/145* (2013.01)

(58) Field of Classification Search
CPC ............ H01S 5/1075; H01S 2301/145; H01S 5/40–426
See application file for complete search history.

(56) References Cited

U.S. PATENT DOCUMENTS 5,343,490 A * 8/1994 McCall ................. H01S 5/1075
372/67
5,351,261 A * 9/1994 Lanzerotti ............. H01S 5/1075
372/98
(Continued)

FOREIGN PATENT DOCUMENTS

CN 1627576 A 6/2005
CN 101174757 A 5/2008
(Continued)

OTHER PUBLICATIONS

Kurniawan, O. et al., "Surface Plasmon Hybridization of Whispering Gallery Mode Microdisk Laser", Institute of High Performance Computing, A *Star, IEEE, 2023.
(Continued)

*Primary Examiner* — Tod T Van Roy
(74) *Attorney, Agent, or Firm* — Harness, Dickey & Pierce, P.L.C.

(57) ABSTRACT
An optical integrated device may include a substrate, a first laser diode oscillating in a transverse magnetic mode (TM mode) on the substrate, and a second laser diode oscillating in a transverse electric mode (TE mode) on the substrate, wherein the first laser diode includes a first body in a shape of a disk, and through holes penetrating the first body.

10 Claims, 14 Drawing Sheets

(51) Int. Cl.
      *H01S 5/062*          (2006.01)
      *H01S 5/40*           (2006.01)

(56)                    References Cited

U.S. PATENT DOCUMENTS

| | | | | |
|---|---|---|---|---|
| 5,825,799 | A * | 10/1998 | Ho | G02F 1/011 |
| | | | | 385/32 |
| 5,878,070 | A * | 3/1999 | Ho | H01S 5/1075 |
| | | | | 385/32 |
| 5,926,496 | A * | 7/1999 | Ho | G02F 1/3133 |
| | | | | 372/67 |
| 6,333,944 | B1 * | 12/2001 | Capasso | H01S 3/083 |
| | | | | 372/98 |
| 6,577,661 | B1 | 6/2003 | Wang et al. | |
| 7,272,275 | B2 * | 9/2007 | Spoonhower | G02B 6/12004 |
| | | | | 345/55 |
| 7,489,717 | B2 | 2/2009 | Baba et al. | |
| 7,528,403 | B1 | 5/2009 | Borselli et al. | |
| 8,755,414 | B2 * | 6/2014 | Claudon | H01S 5/0604 |
| | | | | 372/4 |
| 10,211,597 | B2 * | 2/2019 | Baik | H01S 5/04254 |
| 10,868,406 | B2 * | 12/2020 | Kim | H01S 3/08086 |
| 11,081,859 | B2 * | 8/2021 | Singer | G01S 17/34 |
| 11,239,634 | B2 * | 2/2022 | Osinski | H01S 5/2205 |
| 11,966,103 | B2 * | 4/2024 | Park | H01P 7/06 |
| 2011/0080931 | A1 | 4/2011 | Tredicucci et al. | |
| 2012/0093189 | A1 | 4/2012 | Fattal et al. | |
| 2014/0226691 | A1 * | 8/2014 | Kim | H01S 5/1042 |
| | | | | 372/45.01 |
| 2016/0056611 | A1 * | 2/2016 | Baik | H01S 5/04257 |
| | | | | 372/45.01 |
| 2018/0159295 | A1 | 6/2018 | Kim | |
| 2018/0261977 | A1 | 9/2018 | Feng et al. | |
| 2019/0097378 | A1 * | 3/2019 | Choi | H01S 3/08018 |
| 2020/0222399 | A1 | 7/2020 | Hoveyda et al. | |
| 2023/0198226 | A1 * | 6/2023 | Choi | H01S 5/026 |
| | | | | 372/27 |

FOREIGN PATENT DOCUMENTS

| | | | | | |
|---|---|---|---|---|---|
| JP | H09-186409 | A | | 7/1997 | |
| JP | 2012/078512 | A | | 4/2012 | |
| KR | 19990030833 | A | * | 5/1999 | |
| KR | 10-2008-0052228 | A | | 6/2008 | |
| KR | 10-2017-0038521 | A | | 4/2017 | |
| KR | 10-2017-0124566 | A | | 11/2017 | |
| KR | 10-2019-0035405 | A | | 4/2019 | |
| WO | WO-2012154209 | A1 | * | 11/2012 | B82Y 20/00 |
| WO | WO-2018110816 | A1 | | 6/2018 | |
| WO | WO-2019190119 | A1 | * | 10/2019 | G02B 6/293 |

OTHER PUBLICATIONS

Claire Gmachl et al., 'Long-Wavelength (9.5-11.5 μm) Microdisk Quantum-Cascade Lasers' *IEEE Journal of Quantum Electronics*, vol. 33, No. 9, Sep. 1997.

Yushin Kim et al., "Designing whispering gallery modes via transformation optics", natrue photonics, 2016.

Joong-Seon Choe et al., "A spot-size converter-integrated 1.3 ?m TM mode LD for coupling with surface-plasmon polariton waveguides", Semicond. Sci. Technol. 25 (2010).

Takehiro Fukushima et al., "Lasing of TM modes in a two-dimensional GaAs microlaser", Optics Express, 2014.

International Search Report for International Application No. PCT/KR2020/009002 dated Oct. 15, 2020.

* cited by examiner $n3 < n4$

Möbius transformation

LASER DIODE, OPTICAL INTEGRATED DEVICE, AND MANUFACTURING METHOD THEREOF

CROSS-REFERENCE TO RELATED APPLICATIONS

This application is a national phase under 35 U.S.C. § 371 of PCT International Application No. PCT/KR2020/009002 which has an International filing date of July 9, 2020, which claims priority to Korean Patent Application No. 10-2019-0083024, filed date of July 10, 2019, the entire contents of each of which are hereby incorporated by reference.

TECHNICAL FIELD

The present invention relates to a laser diode, an optical integrated device, and a manufacturing method thereof, and more particularly, to an optical integrated device including a laser diode using transformation optics, and a manufacturing method thereof.

BACKGROUND ART

Transformation optics is a research field that attempts to arbitrarily control the flow of light by controlling the distribution of material constants (e.g., dielectric constant, transmittance, and refractive index) in space. This has become a new paradigm for nano-optical research, and various application possibilities are suggested as well as basic research.

DISCLOSURE OF THE INVENTION

Technical Problem

An object of the present invention is to provide a laser diode and an optical integrated device with improved performance.

Technical Solution

An optical integrated device according to the present invention includes a substrate, a first laser diode oscillating in a transverse magnetic mode (TM mode) on the substrate, and a second laser diode oscillating in a transverse electric mode (TE mode) on the substrate, wherein the first laser diode may include a first body in a shape of a disk, and through holes penetrating the first body.

According to some embodiments, the second laser diode may include a second body in a shape of a disk, wherein a distance from an upper surface of the substrate to an upper surface of the first body may be the same as a distance from the upper surface of the substrate to an upper surface of the second body.

According to some embodiments, the first body may have a non-uniform curvature.

According to some embodiments, an area ratio of the through holes per unit area of the first body may be non-uniform.

According to some embodiments, a number of the through holes per unit area of the first body may be non-uniform.

According to some embodiments, a diameter of the through hole per unit area of the first body may be non-uniform.

According to some embodiments, at least a portion of the first body may have a non-homogeneous refractive index.

According to some embodiments, the optical integrated device may further include an optical waveguide on the substrate, the optical waveguide being between the first and second laser diodes.

According to some embodiments, the first body may have a non-uniform curvature, wherein a curvature of a portion of the first body adjacent to the optical waveguide may be less than a curvature of another portion of the first body spaced apart from the optical waveguide.

According to some embodiments, each of the first and second bodies may include upper and lower clad layers and a gain medium interposed between the upper and lower clad layers.

According to some embodiments, a diameter of the through hole may be less than a length of a wavelength of emitted light.

In the laser diode comprising a body in a shape of a disk according to the present invention, the body may have a non-uniform curvature, and the TM mode and the TE mode may be selectively oscillated according to the refractive index distribution in the body.

According to some embodiments, at least a portion of the body may have non-homogeneous dielectric permittivity and oscillate in a TM mode.

According to some embodiments, the body may include upper and lower clad layers, and a gain medium interposed between the upper and lower clad layers.

According to some embodiments, the laser diode may further include through holes penetrating the body.

According to some embodiments, an area ratio of the through holes per unit area of the body may be non-uniform.

According to some embodiments, a diameter of the through hole may be less than a length of a wavelength of incident light.

A method of manufacturing an optical integrated device according to the present invention may include forming a first semiconductor layer, a second semiconductor layer, and a gain medium layer interposed between the first semiconductor layer and the second semiconductor layer on a substrate, forming a mask layer on the second semiconductor layer, patterning the mask layer to form first and second mask patterns, forming a first laser diode oscillating in a TM mode by patterning the second semiconductor layer, the gain layer, and the first semiconductor layer using the first mask pattern, and forming a second laser diode oscillating in a TE mode by patterning the second semiconductor layer, the gain layer, and the first semiconductor layer using the second mask pattern, wherein the forming of the first laser diode may include forming through holes penetrating the second semiconductor layer, the gain layer, and the first semiconductor layer to control a refractive index of the patterned second semiconductor layer, the gain layer, and the first semiconductor layer.

According to some embodiments, the forming of the first laser diode may include controlling a path of incident light into the patterned second semiconductor layer, the gain layer, and the first semiconductor layer by controlling a dielectric permittivity of the patterned second semiconductor layer, the gain layer, and the first semiconductor layer.

According to some embodiments, the controlling of the dielectric permittivity may include controlling the dielectric permittivity by controlling an area ratio of the through holes per unit area of the first mask pattern.

Advantageous Effects

According to the concept of the present invention, a laser diode (e.g., a laser diode oscillating in TM mode) may be implemented using transformation optics. Accordingly, there is no need to apply an external force (e.g., tensile stress, etc.) when forming a laser diode (e.g., when growing a wafer for a laser diode), so that it is possible to prevent a decrease in gain and a shortened lifespan. In addition, laser diodes of TM mode and TE mode may be implemented on a single chip, so that TM mode and TE mode may be oscillated at the same time. When the optical integrated device according to the embodiment of the present invention is applied to the field of optical communication, since two different polarization modes (TM mode and TE mode) may be used for a single wavelength, the data transfer rate may be improved.

BRIEF DESCRIPTION OF THE DRAWINGS

FIG. 1b is a view showing the curvature of the body of FIG. 1a.

FIGS. 5a to 5d are diagrams illustrating a process of forming the optical integrated device of FIG. 3a.

MODE FOR CARRYING OUT THE INVENTION

Figure 1A:
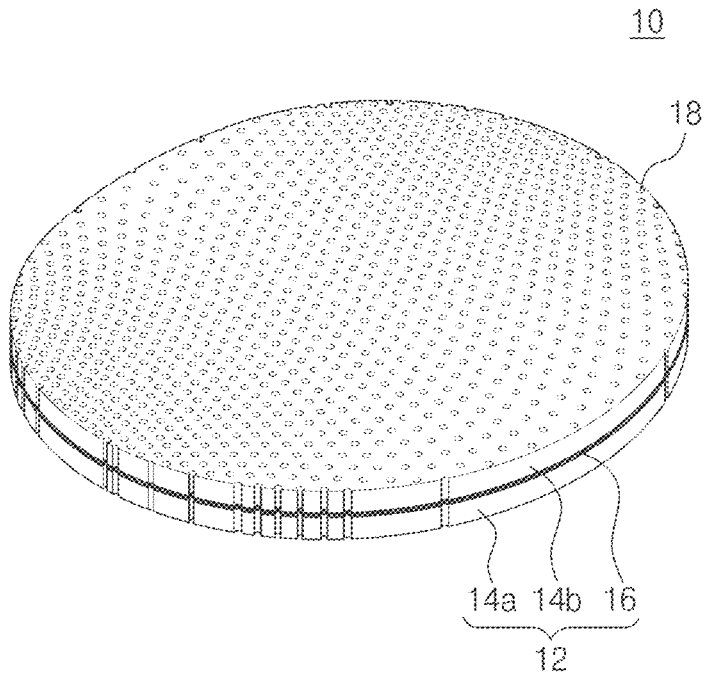
FIG. 1a is a diagram in accordance with some embodiments of the present invention, illustrating a laser diode.

In order to fully understand the configuration and effects of the present invention, embodiments of the present invention will be described in detail with reference to the accompanying drawings. The present invention is not limited to the embodiments disclosed below, but may be implemented in various forms, and various modifications and changes may be added. However, it is provided to completely disclose the technical idea of the present invention through the description of the present embodiments, and to fully inform a person of ordinary skill in the art to which the present invention belongs.

In this specification, when a component is referred to as being on another component, it may be directly formed on the other component or a third component may be interposed therebetween. In addition, in the drawings, the thickness of the components is exaggerated for effective description of the technical content. Like reference numerals refer to like elements throughout the specification.

The embodiments described herein will be described with reference to cross-sectional and/or plan views, which are ideal illustrative views of the present invention. In the drawings, thicknesses of films and regions are exaggerated for effective description of technical content. Accordingly, the regions illustrated in the drawings have schematic properties, and the shapes of the regions illustrated in the drawings are intended to illustrate a specific shape of the device region and are not intended to limit the scope of the invention. In various embodiments of the present specification, terms such as first, second, third, etc. are used to describe various components, but these components should not be limited by these terms. These terms are only used to distinguish one component from another component. The embodiments described and illustrated herein also include complementary embodiments thereof.

The terms used in this specification are for describing embodiments and are not intended to limit the present invention. In this specification, the singular form also includes the plural form unless specifically stated in the phrase. As used in the specification, "comprises" and/or "comprising" do not exclude the presence or addition of one or more other elements.

Hereinafter, the present invention will be described in detail with reference to the accompanying drawings.

Figure 1B:
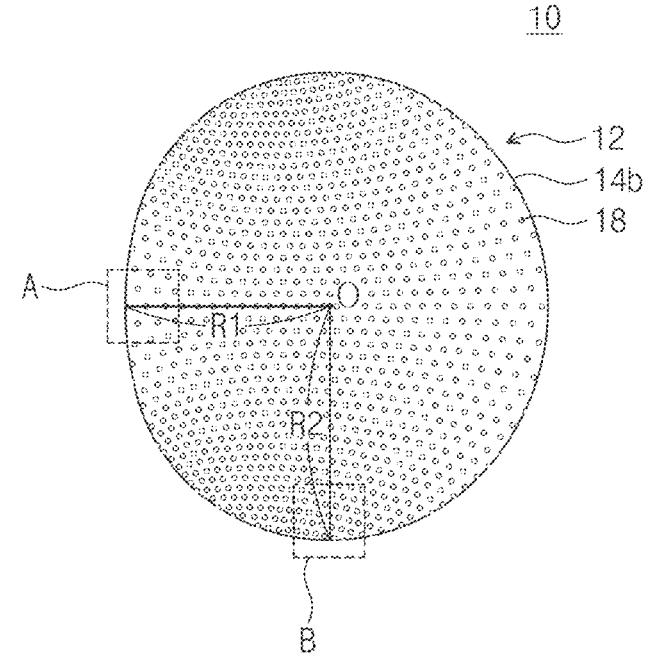

FIG. 1a shows a laser diode 10 in a diagram in accordance with some embodiments of the present invention. FIG. 1b is a view showing the curvature of a body 12 of FIG. 1b.

The laser diode 10 according to embodiments of the present invention may be formed by applying transformation optics. Transformation optics means that the path of light may be controlled by adjusting the distribution of the material constant (refractive index) in space. In other words, a resonator having a specific shape may behave like a resonator of an effective shape, each of which depends on the refractive index (e.g., permittivity and/or permeability).

The laser diode 10 may selectively oscillate a transverse magnetic mode (TM mode) and transverse electric mode (TE mode) according to a refractive index distribution in the body 12. As an example, in this specification, a TM mode laser diode oscillating in TM mode by fixing magnetic permeability in the body 12 and controlling dielectric permittivity will be described as an example.

The laser diode 10 includes a body 12. The body 12 may be provided in a disk shape. For example, the body 12 may have a micro disk shape.

Referring to FIGS. 1a and 1b, the body 12 may have non-uniform curvatures. In other words, the plane of the body 12 may not be a perfect circle with a constant curvature. Curvature refers to the degree of bending of a curve, and if the radius of the arc of the corresponding part is R, it may be defined as $1/R$. A first curvature $1/(R1)$ of a portion A of the body 12 of FIG. 1b may be different from a first curvature $1/(R2)$ of another portion B of the body 12. The first curvature $1/(R1)$ of one portion A of the body 12 may be less than the first curvature $1/(R2)$ of the other portion B of the body 12.

Referring again to FIG. 1a, the body 12 may include a lower clad layer 14a, an upper clad layer 14b, and a gain medium 16.

The lower clad layer 14a may include a semiconductor material. For example, the lower clad layer 14a may include an n-type or p-type semiconductor material. The lower clad layer 14a may include, for example, any one of InGaAsP, InGaAs, AlGaAsP, and AlGaAs, but is not limited thereto.

The upper clad layer 14b may have a size and/or shape corresponding to that of the lower clad layer 14a. The upper clad layer 14b may include a semiconductor material. For example, the upper clad layer 14b may include an n-type or p-type semiconductor material. The upper clad layer 14b may include, for example, any one of InGaAsP, InGaAs, AlGaAsP, and AlGaAs, but is not limited thereto. The upper clad layer 14b may have a different conductivity type than that of the lower clad layer 14a.

The gain medium 16 may be interposed between the lower clad layer 14a and the upper clad layer 14b. The gain medium 16 may have a size and/or shape corresponding to each of the lower clad layer 14a and/or the upper clad layer 14b. The gain medium 16 may absorb energy to generate laser light. The gain medium 16 may include multi quantum wells. The gain medium 16 may include, for example, any one of InGaAsP, InGaAs, AlGaAsP, and AlGaAs, but is not limited thereto.

Through holes 18 penetrating the body 12 may be provided. Each of the through holes 18 may be formed to pass through the upper clad layer 14b, the gain medium 16, and the lower clad layer 14a. The diameter of the through hole 18 may be less than the length of the wavelength of the emitted light. For example, the diameter of the through hole 18 may be less than about $\frac{1}{10}$ of the wavelength length of the emitted light. According to an area ratio of the through holes 18 per unit area of the body 12, a difference in local dielectric permittivity may occur. For example, since the portion including the through hole 18 is in contact with and/or includes air, the dielectric permittivity may be controlled according to the ratio of the through hole 18. As an example, referring to FIG. 2f, a portion in which the through holes 18 are formed in relatively large numbers per unit area may have a lower dielectric permittivity than a portion in which the through holes 18 are formed in a relatively small number per unit area.

Figure 1C:
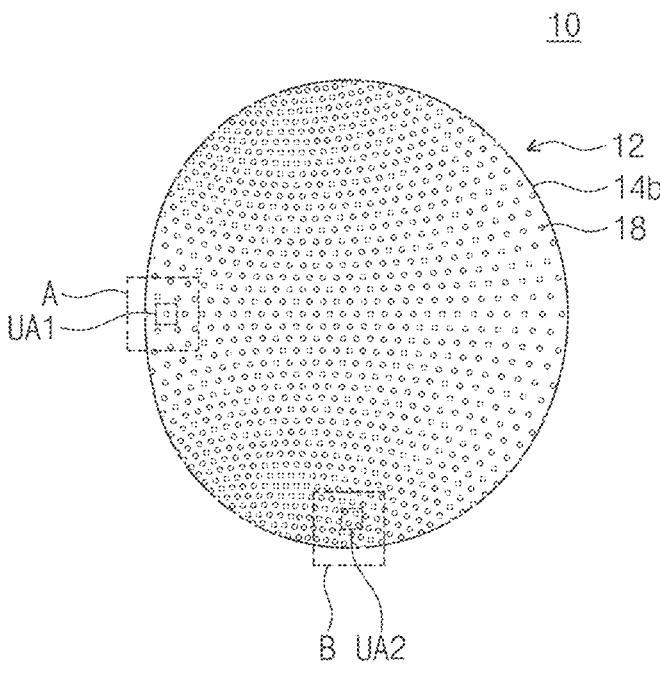
FIG. 1c is a diagram illustrating an area ratio of through holes per unit area of a body according to an embodiment.

FIG. 1c is a view showing an area ratio of the through holes 18 per unit area of the body 12 according to an embodiment. Referring to FIG. 1c, the area ratio of the through holes 18 per unit area of the body 12 may be non-uniform. FIG. 1c shows, for example, that through holes 18 having the same diameter are formed. The number of through holes 18 formed in the unit area UA1 of the portion A of the body 12 of FIG. 1c may be different from the number of through holes 18 formed in the unit area UA2 of the portion B of the body 12. The number of through holes 18 formed in the unit area UA1 of the portion A of the body 12 may be less than the number of through holes 18 formed in the unit area UA2 of the one portion B of the body 12. As an example, the number of through holes 18 formed in the unit area UA1 of the portion A of the body 12 may be one, and the number of through holes 18 formed in the unit area UA2 of the one portion B of the body 12 may be four. Accordingly, the area ratio of the through holes 18 formed in the unit area UA1 of the portion A of the body 12 may be less than the area ratio of the through holes 18 formed in the unit area UA2 of the portion B of the body 12.

Figure 1D:
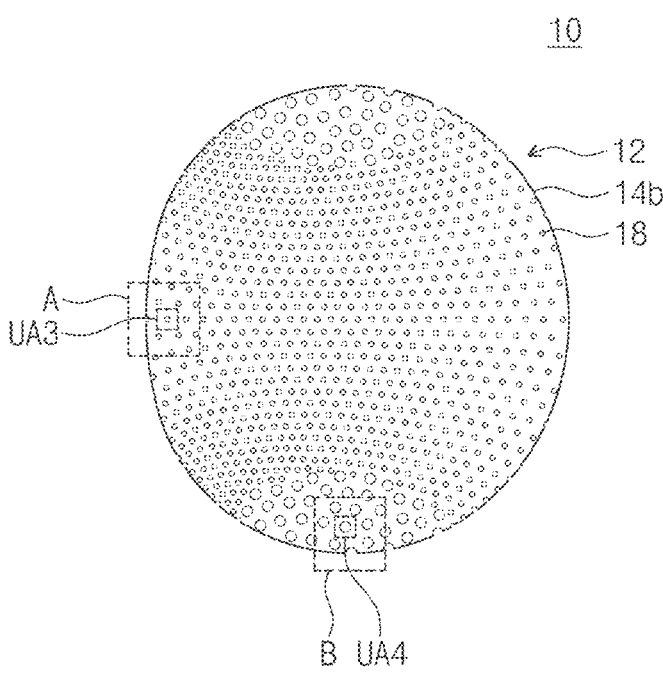
FIG. 1d is a diagram illustrating an area ratio of through holes per unit area of a body according to an embodiment.

FIG. 1d is a view showing an area ratio of the through holes 18 per unit area of the body 12 according to an embodiment. Referring to FIG. 1d, the area ratio of the through holes 18 per unit area of the body 12 may be non-uniform. FIG. 1d shows, for example, that through holes 18 having different diameters are formed in the body 12. The number of through holes 18 formed in the unit area UA3 of the portion A of the body 12 of FIG. 1d may be different from the number of through holes 18 formed in the unit area UA4 of the portion B of the body 12. However, the diameter of the through hole 18 formed in the unit area UA3 of the portion A of the body 12 may be less than the diameter of the through hole 18 formed in the unit area UA4 of the portion B of the body 12. Accordingly, the area ratio of the through holes 18 formed in the unit area UA3 of the portion A of the body 12 may be less than the area ratio of the through holes 18 formed in the unit area UA4 of the portion B of the body 12.

Figure 2A:
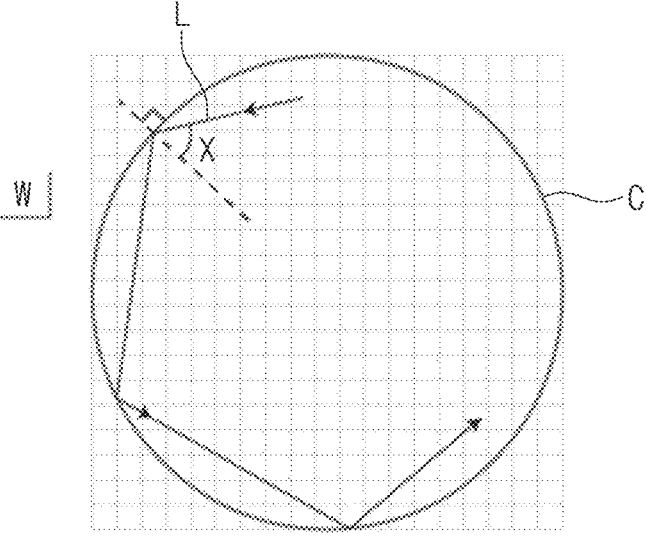
FIGS. 2a to 2h are views illustrating deriving a body shape according to an embodiment of the present invention by applying transformation optics.
Figure 2B:
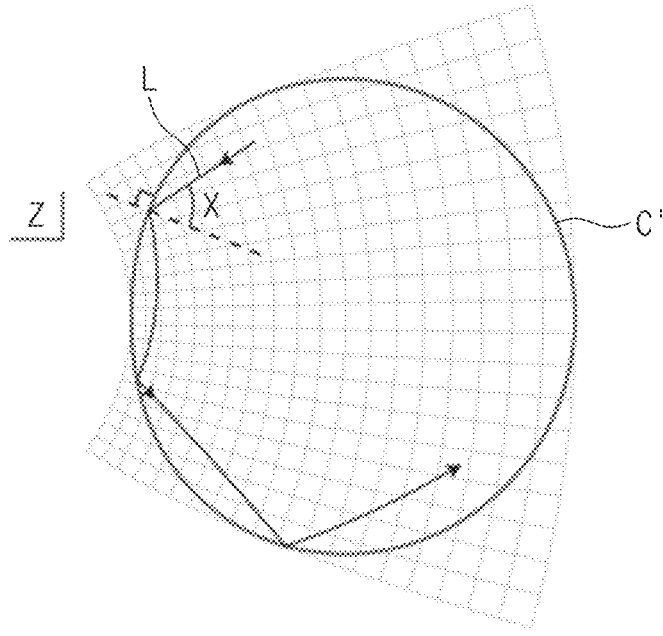
Figure 2C:
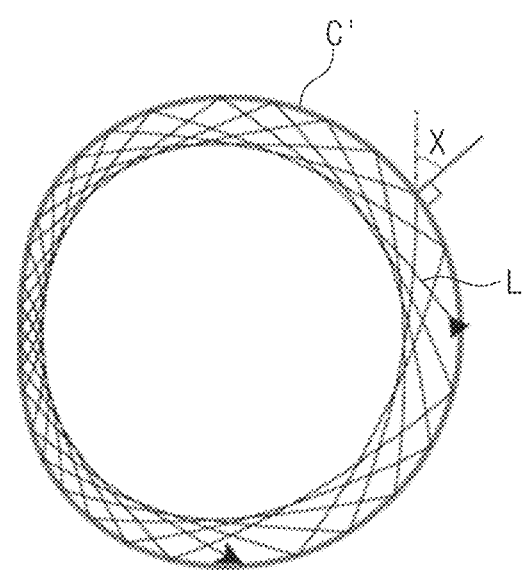
Figure 2D:
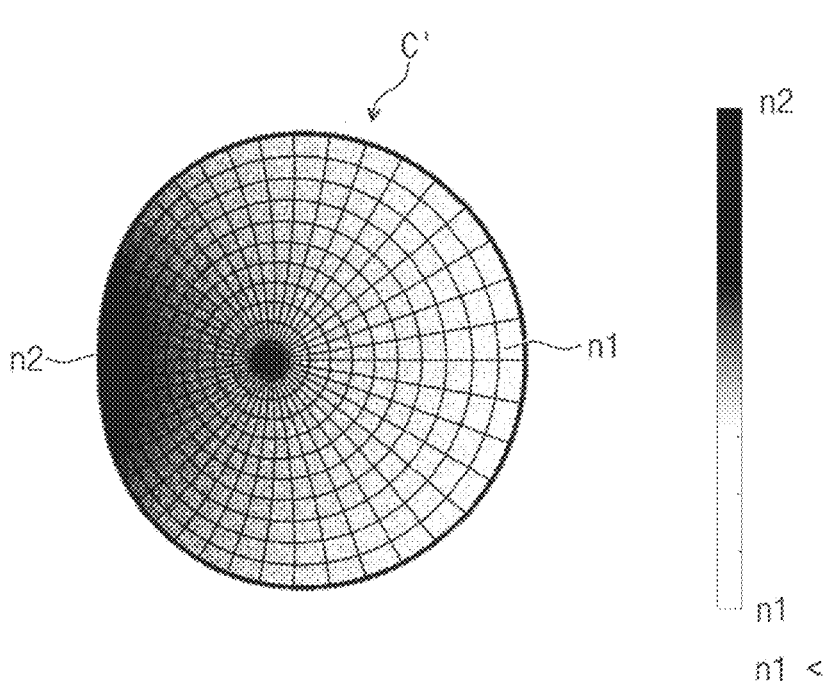
Figure 2E:
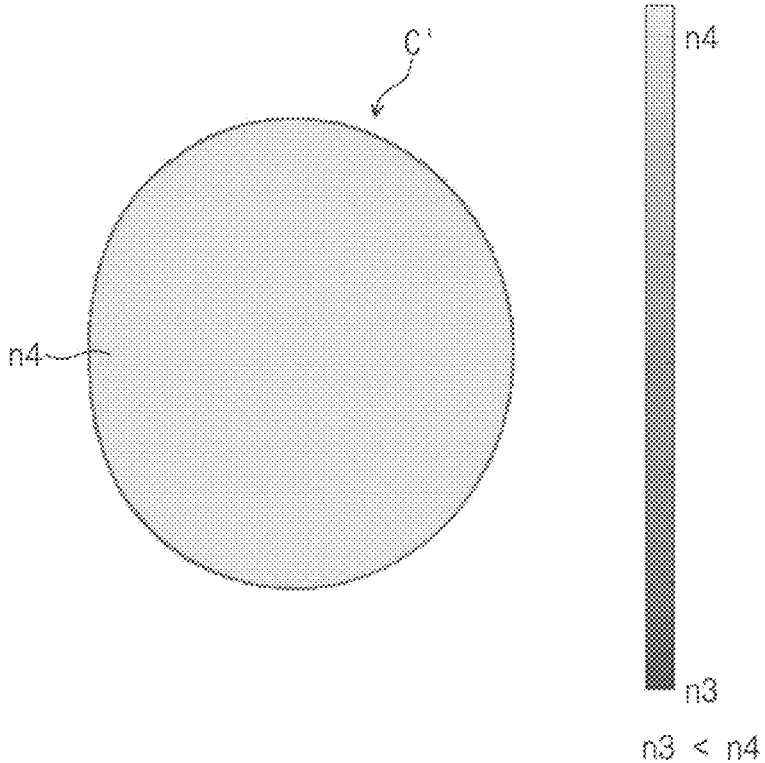
Figure 2F:
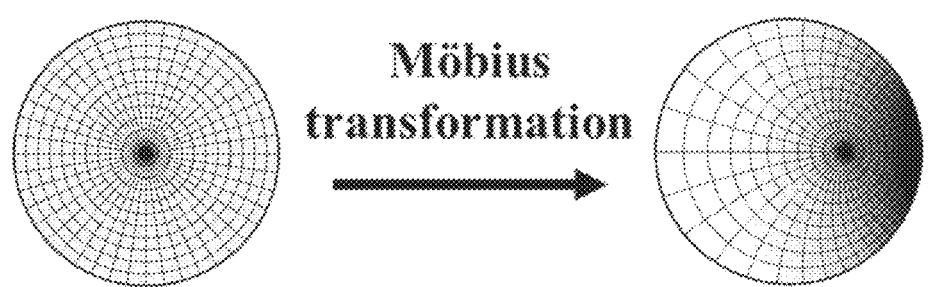

FIGS. 2a to 2f are views illustrating deriving a body shape according to an embodiment of the present invention by applying transformation optics. In order to explain that transformation optics is applied, a cavity will be described below as an example. A cavity is an empty space surrounded by a conductive wall, and when the cavity is excited with microwaves (e.g., electromagnetic waves or light), it may resonate at a specific frequency/wavelength (e.g., the frequency/wavelength may be defined by the shape or size of the conductor wall). First, it is possible to obtain a cavity C' in FIG. 2b having a deformed shape by performing coordinate transformation of a circular cavity C in FIG. 2a in a general coordinate system. At this time, it is assumed that the circular cavity C in FIG. 2a is a linear isotropic dielectric medium having no source charge or current. If conformal mapping is adopted as a coordinate transformation, the deformed cavity C' may be, for example, a Limaçon shape, but this is only an example and is not limited thereto, and the coordinate system of the deformed shape C' may be expressed as follows, for example.

$$z = \beta(w + \alpha w^2), \beta = 1/\sqrt{1 + 4\alpha(1 + \alpha)}$$

Referring to FIGS. 2a and 2b, when the coordinate transformation is an isometric transformation, the reflection angle X of the light L in the cavities C and C' before and after transformation may be maintained the same. Accordingly, referring to FIG. 2c, the total reflection condition may be maintained in the deformed cavity C'. For example, the whispering gallery mode may be maintained within the deformed cavity C'. The whispering gallery mode refers to a resonance phenomenon in which light is trapped for a very long time due to total internal reflection along an interface in a symmetrical resonator (e.g., a sphere) or a resonance wave (mode) of light corresponding thereto.

Referring to FIG. 2d, the refractive index of the deformed cavity C' may be obtained as follows (in this case, it is assumed that the refractive index outside the cavity is 1). At this time, the deformed cavity C' may correspond to (a) of FIG. 2g, which will be described later.

$$\frac{n(z)}{n_0} = \left| \frac{dw}{dz} \right| = \frac{1}{\beta \left| \sqrt{1 + 4\alpha z/\beta} \right|}, n_0 = 1.8$$

Referring to FIG. 2e, the deformed cavity C' may be transformed to have a constant refractive index. As an example, the deformed cavity C' may have a constant refractive index (e.g., n4) by complex transformation (e.g., multiple mapping). This is for controlling the refractive index in the cavity, and the type and number of complex transformations may not be limited thereto.

As an example, before performing Limaçon coordinate transformation, Möbius transformation may be performed as follows.

$$z_1(\omega)$$

$$z_1 = \alpha \frac{\omega + \delta}{1 + \omega \delta}$$

Figure 2G:
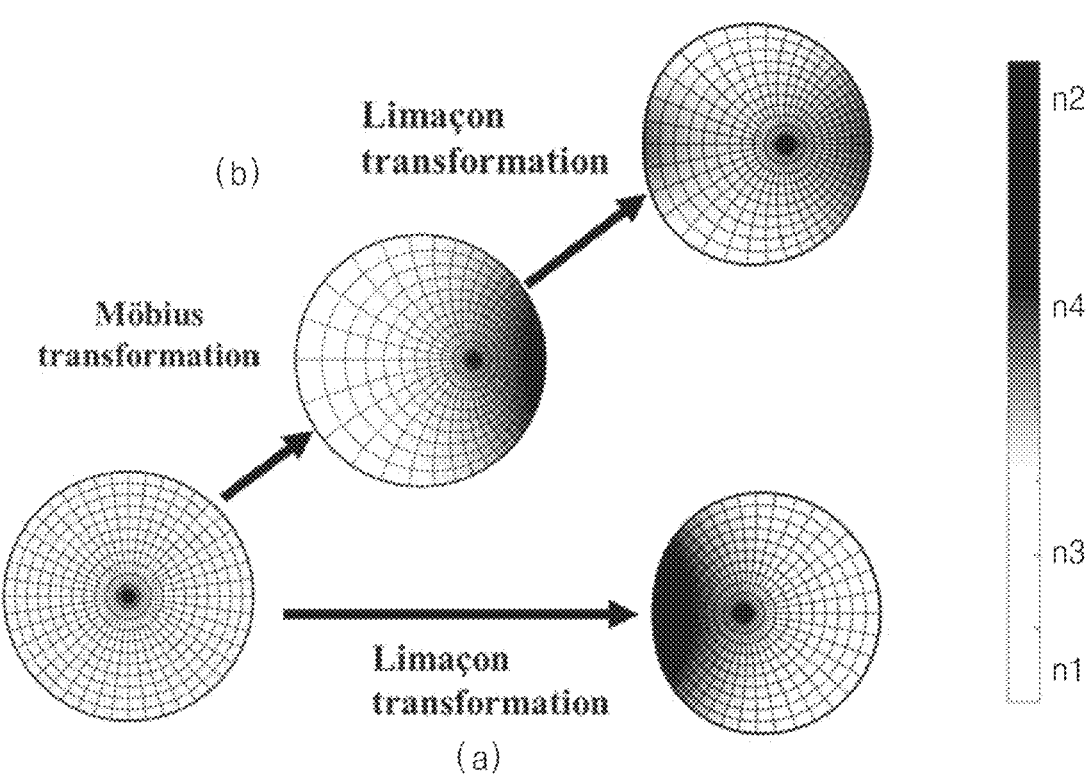

After performing the Möbius transformation and the coordinate transformation that moves only the center of the circular figure without changing the shape (refer to FIG. 2f), the final complex transformation may be performed (refer to (b) of FIG. 2g).

$$z_2(\omega) = z \circ z_1(\omega) = z(z_1(\omega))$$

Through this, it is possible to obtain various spatial refractive index distributions for one deformed cavity shape.

In addition, if an appropriate synthesis function (e.g., Möbius transformation, etc.) is introduced in the intermediate process, the gap between the maximum refractive index and the minimum refractive index required when designing the transformation cavity may be reduced. Since most semiconductor materials have a limited refractive index value, reducing the refractive index difference required in the design may facilitate the implementation of the transformation cavity. At this time, it is not necessary to know a specific functional formula (e.g., z of $z \circ z_1(\omega)$) for performing the conformal transformation connecting the outer shape of the circular cavity and the deformed cavity.

Figure 2H:
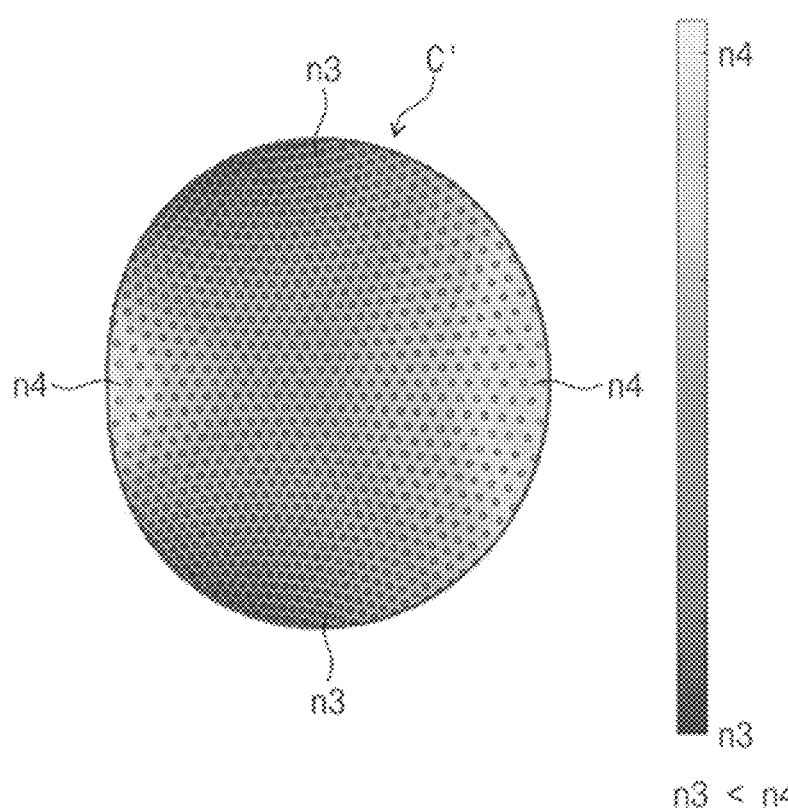

Referring to FIG. 2h, by forming through holes 18 in the deformed cavity C' to have a constant refractive index (e.g., n4), the refractive index of the deformed cavity C' may be controlled. Comparing FIGS. 2e and 2h, when the through holes 18 are formed in the deformed cavity C', it may be confirmed that a difference in refractive index distribution occurs within the body 12. For example, the refractive index of portions having many through holes 18 per unit area may have n3 less than n4. Also, due to multiple mapping, the refractive index difference (n3–n4 in FIG. 2f) within the deformed cavity C' may be less than the refractive index difference (n1–n2 in FIG. 2d) within the deformed cavity C' of FIG. 2d. The theoretical background for selectively applying transformation optics to the TM mode is as follows.

It is assumed that the circular cavity C in FIG. 2a is a linearly isotropic dielectric medium with no source charge or current, and when transformation optics is applied, Maxwell's equations in the frequency domain are transformed as shown in [Equation 1] below by general coordinate transformation.

$$\nabla \times \tilde{H} = i\omega \ddot{\varepsilon} \tilde{E} \qquad \text{[Equation 1]}$$

$$\nabla \times \tilde{E} = -i\omega \ddot{\mu} \tilde{H}$$

$$\text{where, } \ddot{\varepsilon} = \varepsilon \frac{JJ^T}{\det J}, \ddot{\mu} = \mu_0 \frac{JJ^T}{\det J}$$

and J are Jacobian matrices related to coordinate transformation.

Here, if conformal mapping is adopted as the coordinate transformation, the tensor quantity $\ddot{\varepsilon}$ and $\ddot{\mu}$, may be as shown in [Equation 2] below.

$$\ddot{\varepsilon} = \varepsilon \begin{pmatrix} 1 & 0 & 0 \\ 0 & 1 & 0 \\ 0 & 0 & \frac{1}{\det J} \end{pmatrix}, \ddot{\mu} = \mu_0 \begin{pmatrix} 1 & 0 & 0 \\ 0 & 1 & 0 \\ 0 & 0 & \frac{1}{\det J} \end{pmatrix} \qquad \text{[Equation 2]}$$

With respect to [Equation 2], in the case of TM polarization mode ($\vec{E} = \tilde{E}_z \hat{z}$, $\vec{H} \cdot \hat{z} = 0$), a wave equation as shown in [Equation 3] below is obtained for the electric field $\tilde{E}_z$.

$$\nabla^2 \tilde{E}_z + \omega^2 \varepsilon \mu_0 \left(\frac{1}{\det J}\right) \tilde{E}_Z = 0 \qquad \text{[Equation 3]}$$

On the other hand, for [Equation 2], in the case of the TE polarization mode ($\vec{H} = \tilde{H}_z \hat{z}$, $\vec{E} \cdot \hat{z} = 0$), a wave equation as shown in [Equation 4] below is obtained for the magnetic field $\tilde{H}_z$.

$$\nabla^2 \tilde{H}_z + \omega^2 \varepsilon \mu_0 \left(\frac{1}{\det J}\right) \tilde{H}_z = 0 \qquad \text{[Equation 4]}$$

Here, to implement a dielectric resonator based on actual transformation optics, the magnetic permeability is fixed to $\mu_0$, which is the value in vacuum, and only the electric dielectric permittivity $\varepsilon$ may be adjusted to have a different value depending on the position. In this case, the tensors $\ddot{\varepsilon}$ and $\ddot{\mu}$ are given as in [Equation 5] below.

$$\ddot{\varepsilon} = \frac{\varepsilon}{\det J} \begin{pmatrix} 1 & 0 & 0 \\ 0 & 1 & 0 \\ 0 & 0 & 1 \end{pmatrix}, \ddot{\mu} = \mu_0 \begin{pmatrix} 1 & 0 & 0 \\ 0 & 1 & 0 \\ 0 & 0 & 1 \end{pmatrix} \qquad \text{[Equation 5]}$$

Obtaining the wave equations for the TM/TE polarization mode according to $\ddot{\varepsilon}$ and $\ddot{\mu}$ given above is as follows.

In the case of TM polarization mode, the wave equation is as follows [Equation 6].

$$\nabla^2 \tilde{E}_z + \omega^2 \varepsilon \mu_0 \left(\frac{1}{\det J}\right) \tilde{E}_Z = 0 \qquad \text{[Equation 6]}$$

[Equation 6] is the same as [Equation 3], which is obtained from the complete transformation optics that converts both magnetic permeability and dielectric permittivity. That is, in the case of TM polarization mode, even when only the dielectric permittivity is changed according to the transformation optics rule, this means that the TM mode in the original space (circular resonator; homogeneous cavity) is transformed into the target space (transformation resonator; inhomogeneous cavity) without loss of the quality factor Q.

However, in the case of the TE polarization mode, the wave equation is as follows [Equation 7].

$$\nabla^2 \tilde{H}_z +$$
$$\frac{1}{\det J}\left[(\partial_x \det J)\partial_x \tilde{H}_z + (\partial_y \det J)\partial_y \tilde{H}_z\right] + \omega^2 \varepsilon \mu_0 \left(\frac{1}{\det J}\right)\tilde{H}_z = 0 \qquad \text{[Equation 7]}$$

[Equation 7], that is, the wave equation of TE polarization, is different from [Equation 4], which is a wave equation obtained from complete transformation optics due to a new term in the middle. This result means that the TE mode formed in a non-homogeneous dielectric cavity (conversion resonator) with magnetic permeability fixed and dielectric permittivity changed with space differs from the TE mode obtained by simultaneously changing the dielectric permittivity and magnetic permeability in space (complete transformation optics applied). The added new intermediate term in the form of Helmholtz acts like noise in the entire region of the transformation resonator, inevitably causing a significant decrease in the quality value Q.

Conventional laser diodes usually oscillate in TE mode because the reflectance of the TE mode between quantum well slabs is higher than that of the TM mode, and the energy gain of the gain medium is also higher in the TE mode. However, in the case of a transformation cavity in which magnetic permeability is fixed and only dielectric permittivity is changed according to space, as described above, optical loss may occur in the TE mode, thereby rapidly decreasing the optical gain of the TE mode. Accordingly, the TE polarization mode loses a mode competition for laser oscillation with the TM polarization mode, so that the TM polarization mode may oscillate the laser diode 10. Since Maxwall's equations are an equation in which the electromagnetic field and the magnetic field are perfectly symmetric, contrary to that described above by applying the principle of the present invention, when the dielectric permittivity of the material constituting the resonator is fixed and only the magnetic permeability is changed with respect to the space to manufacture the resonator, contrary to the above case, transformation optics may be perfectly applied only for TE mode. In other words, it is theoretically possible to selectively drop only the Q factor of the TM mode.

Figure 3A:
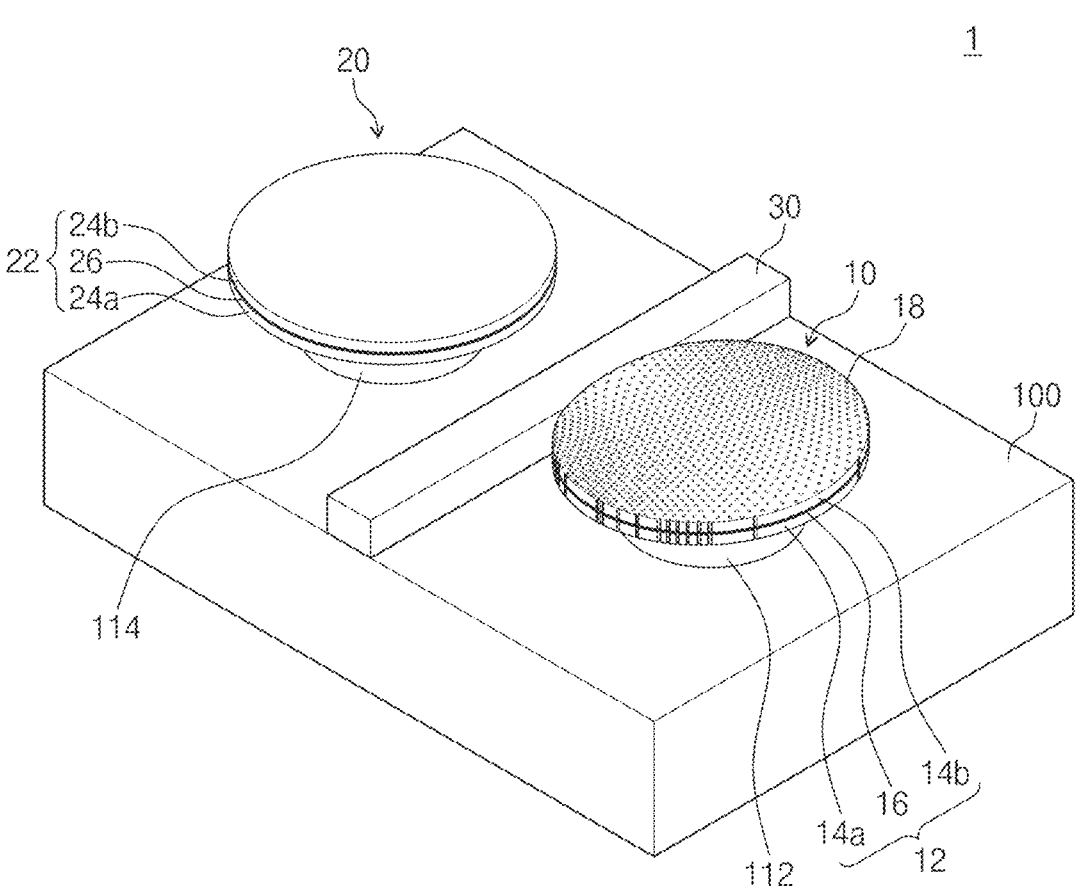
FIG. 3a is a diagram schematically illustrating an optical integrated device including the laser diode of FIG. 1a described above.
Figure 3B:
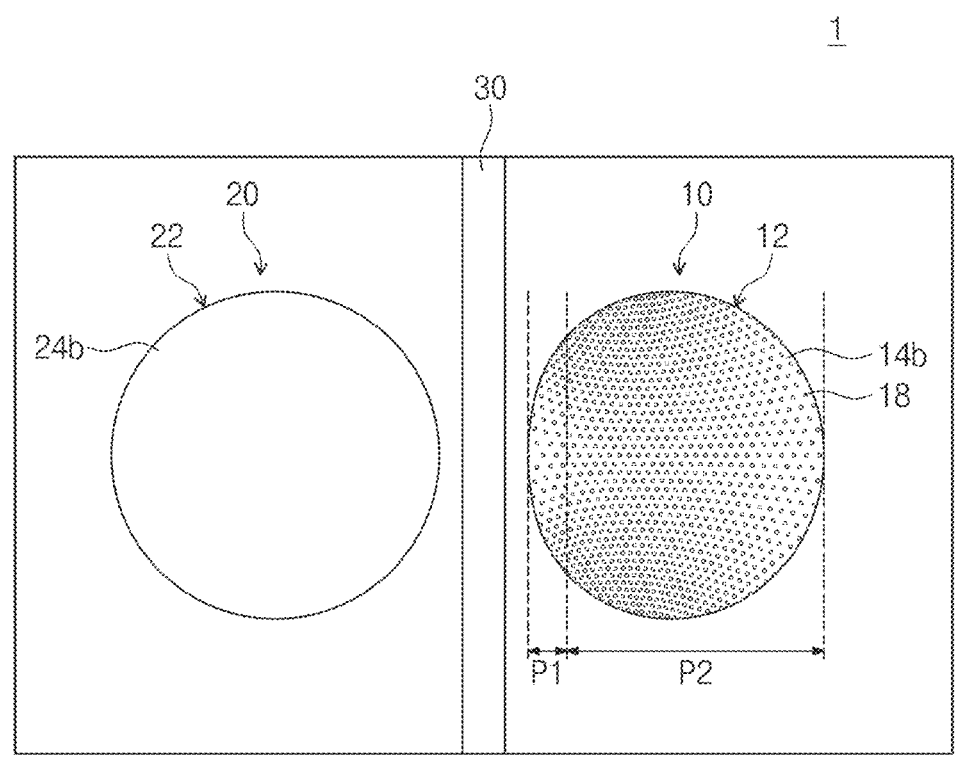
FIG. 3b is a plan view of the optical integrated device of FIG. 3a as viewed from above.

FIG. 3a is a diagram schematically illustrating an optical integrated device 1 including the laser diode 10 of FIG. 1a described above. FIG. 3b is a plan view of the optical integrated device 1 of FIG. 3a as viewed from above.

Referring to FIGS. 3a and 3b, the optical integrated device 1 may include a first laser diode 10, a second laser diode 20, and an optical waveguide 30 on a substrate 100.

The first laser diode 10 may be disposed on one side of the substrate 100. The first laser diode 10 may be a laser diode oscillating in TM mode. The first laser diode 10 may include a first body 12. The first laser diode 10 may be the same as or similar to the laser diode 10 described with reference to FIGS. 1a to 2e, and the first body 12 may also be the same as or similar to the body 12. Accordingly, redundant descriptions are omitted for simplicity of description.

The second laser diode 20 may be disposed on the other side of the substrate 100. The second laser diode 20 may be a laser diode oscillating in a TE mode. The second laser diode 20 may include a second body 22 having a disk shape. The second body 22 may have a perfect circular shape, unlike the first body 12. For example, the second body 22 may have the same curvature as the first body 12. Unlike the first laser diode 10, the second laser diode 20 may be formed without applying transformation optics.

The second body 22 may include a lower clad layer 24a, an upper clad layer 24b, and a gain medium 26.

The lower clad layer 24a may include a semiconductor material. For example, the lower clad layer 24a may include an n-type or p-type semiconductor material. The lower clad layer 24a may include, for example, any one of InGaAsP, InGaAs, AlGaAsP, and AlGaAs, but is not limited thereto.

The upper clad layer 24b may have a size and/or shape corresponding to that of the lower clad layer 24a. The upper clad layer 24b may include a semiconductor material. For example, the upper clad layer 24b may include an n-type or p-type semiconductor material. The upper clad layer 24b may include, for example, any one of InGaAsP, InGaAs, AlGaAsP, and AlGaAs, but is not limited thereto. The upper clad layer 24b may have a different conductivity type than that of the lower clad layer 24a.

The gain medium 26 may be interposed between the lower clad layer 24a and the upper clad layer 24b. The gain medium 16 may have a size and/or shape corresponding to each of the lower clad layer 24a and/or the upper clad layer 24b. The gain medium 26 may absorb energy to generate laser light. The gain medium 26 may include multi quantum wells. The gain medium 26 may include, for example, any one of InGaAsP, InGaAs, AlGaAsP, and AlGaAs, but is not limited thereto.

The optical waveguide 30 may be disposed on the substrate 100 between the first laser diode 10 and the second laser diode 20. The optical waveguide 30 may be disposed to have the same distance from each of the first laser diode 10 and the second laser diode 20.

A first support part 112 supporting the first laser diode 10 and a second support part 114 supporting the second laser diode 20 may be provided on the substrate 100. Due to the first and second support parts 112 and 114, the amount of light trapped by each of the first and second laser diodes 10 and 20 may be increased.

Referring to FIG. 3b, one portion P1 of the first laser diode 10 may be closer to the optical waveguide 30 than the other portion P2. For example, a portion P1 of the first body 12 may be adjacent to the optical waveguide 30, and another portion P2 of the first body 12 may be another portion spaced apart from the optical waveguide 30. A curvature of one portion P1 of the first body 12 may be less than a curvature of another portion P2 of the first body 12. Accordingly, the portion P1 adjacent to the optical waveguide 30 may be close to a line.

Figure 4:
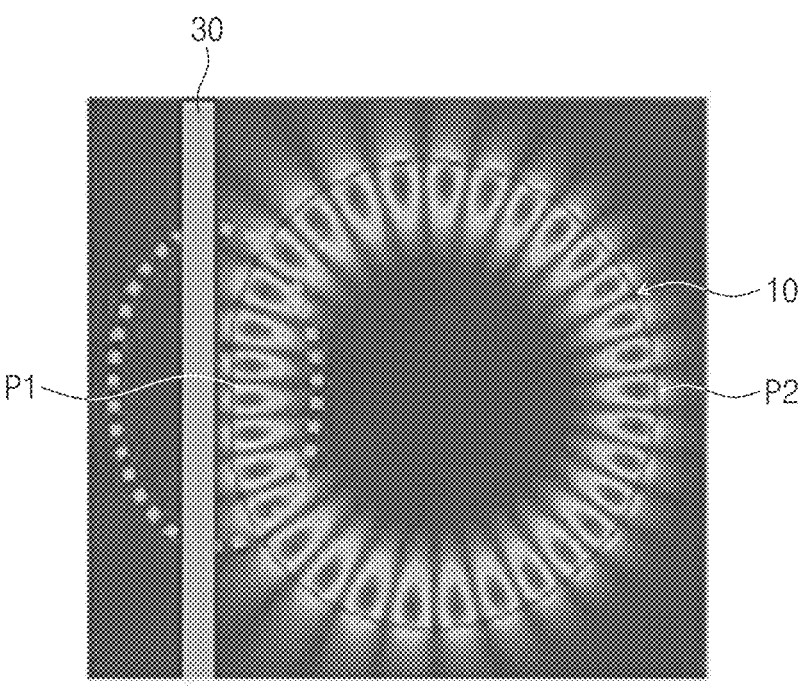
FIG. 4 is a diagram illustrating coupling of an optical waveguide and a first laser diode.

FIG. 4 is a view showing coupling of the optical waveguide 30 and the first laser diode 10. Referring to FIG. 4, a portion P1 adjacent to the optical waveguide 30 is closer to a line, so that a coupling area may be increased compared to a general circular laser diode (e.g., a second laser diode). Accordingly, the light transmission efficiency may be increased.

According to the concept of the present invention, a laser diode (e.g., a laser diode oscillating in TM mode) may be implemented using transformation optics. Accordingly, when forming the laser diode, it is not necessary to apply an external force (e.g., tensile stress, etc.), and thus, it is possible to prevent a decrease in gain and shortening of a lifespan. In addition, laser diodes of TM mode and TE mode may be implemented on a single chip, so that TM mode and TE mode may be oscillated at the same time. When the optical integrated device according to the embodiment of the present invention is applied to the field of optical communication, since two different polarization modes (TM mode and TE mode) may be used for a single wavelength, the data transfer rate may be improved.

FIGS. 5a to 5d are diagrams illustrating a process of forming the optical integrated device 1 of FIG. 3a. Hereinafter, a process of forming the optical integrated device 1 will be described with reference to FIGS. 5a to 5d and 3a.

Figure 5A:
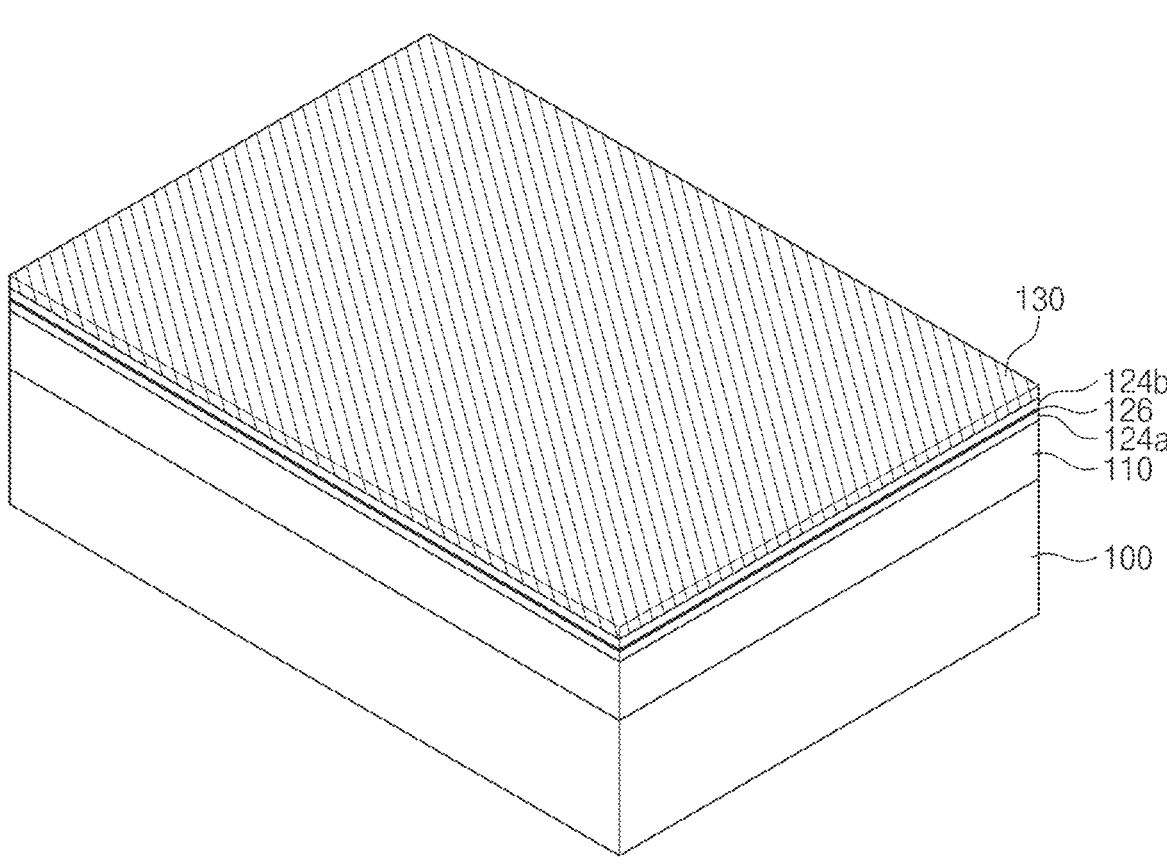

Referring to FIG. 5a, a sacrificial layer 110, a first semiconductor layer 124a, a gain medium layer 126, and a second semiconductor layer 124b may be sequentially formed on the substrate 100. The substrate 100 may be a semiconductor substrate. For example, the substrate 100 may include any one of InP, InGaAsP, InGaAs, AlGaAsP, and AlGaAs, but is not limited thereto. The sacrificial layer 110 may include any one of InP, InGaAsP, InGaAs, AlGaAsP, and AlGaAs, but this is only an example and is not limited thereto.

The first semiconductor layer 124a may include a semiconductor material. For example, the first semiconductor layer 124a may include an n-type or p-type semiconductor material. The first semiconductor layer 124a may include, for example, any one of InGaAsP, InGaAs, AlGaAsP, and AlGaAs, but is not limited thereto.

The second semiconductor layer 124b may have a size and/or shape corresponding to that of the first semiconductor layer 124a. The second semiconductor layer 124b may include a semiconductor material. For example, the second semiconductor layer 124b may include an n-type or p-type semiconductor material. The second semiconductor layer 124b may include, for example, any one of InGaAsP, InGaAs, AlGaAsP, and AlGaAs, but is not limited thereto.

The second semiconductor layer 124b may have a conductivity type different from that of the lower clad layer 124a.

The gain medium layer 126 may be interposed between the first semiconductor layer 124a and the second semiconductor layer 124b. The gain medium layer 126 may have a size and/or shape corresponding to each of the first semiconductor layer 124a and/or the second semiconductor layer 124b. The gain medium layer 126 may absorb energy to generate laser light. The gain medium layer 126 may include multi quantum wells. The gain medium layer 126 may include, for example, any one of InGaAsP, InGaAs, AlGaAsP, and AlGaAs, but is not limited thereto.

A resist layer 130 may be formed on the second semiconductor layer 124b. The resist layer 130 may include PMMA, but is not limited thereto.

Figure 5B:
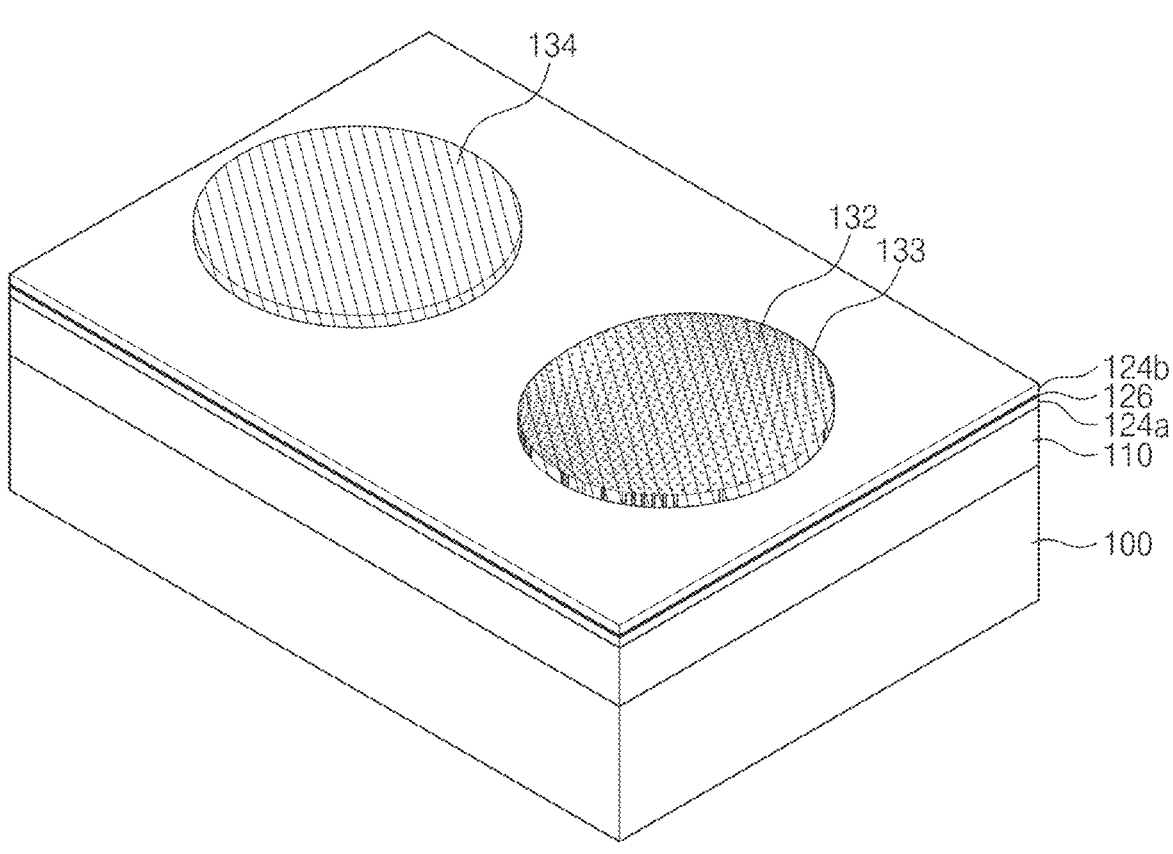

Referring to FIG. 5b, the resist layer 130 may be patterned to form a first mask pattern 132 and a second mask pattern 134. The first mask pattern 132 may have the same shape as the aforementioned first body 12, and the second mask pattern 134 may have the same shape as the aforementioned second body 22. The patterning of the resist layer 130 may use an e-beam lithography process. The first mask pattern 132 may include openings 133.

Figure 5C:
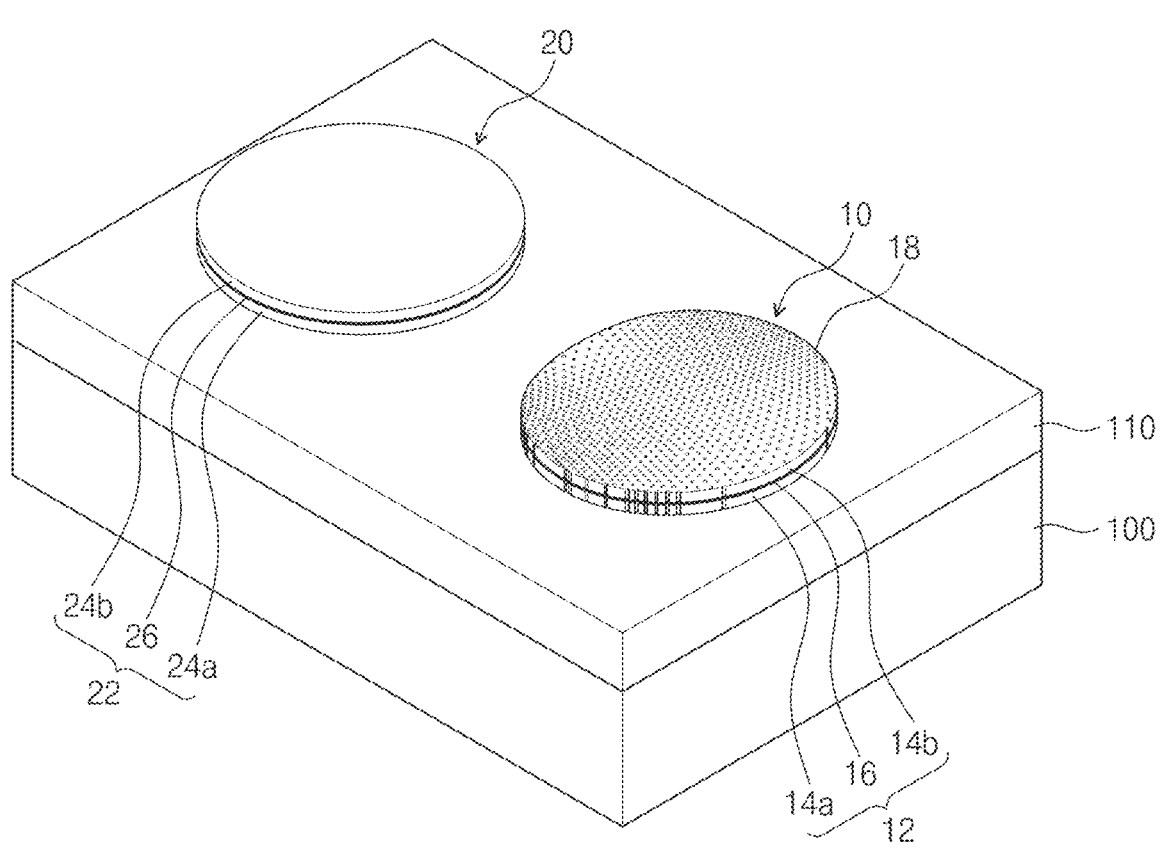

Referring to FIG. 5c, the first body 12 may be formed by etching the second semiconductor layer 124b, the gain medium layer 126, and the first semiconductor layer 124a using the first mask pattern 132 as a mask. The second body 22 may be formed by etching the second semiconductor layer 124b, the gain medium layer 126, and the first semiconductor layer 124a using the second mask pattern 134 as a mask. Forming the first body 12 using the first mask pattern 132 and forming the second body 22 using the second mask pattern 134 may be simultaneously performed. Forming the first body 12 using the first mask pattern 132 and forming the second body 22 using the second mask pattern 134 are, for example, formed using dry etching. After the first body 12 and the second body 22 are formed, the first mask pattern 132 and the second mask pattern 134 may be removed.

Figure 5D:
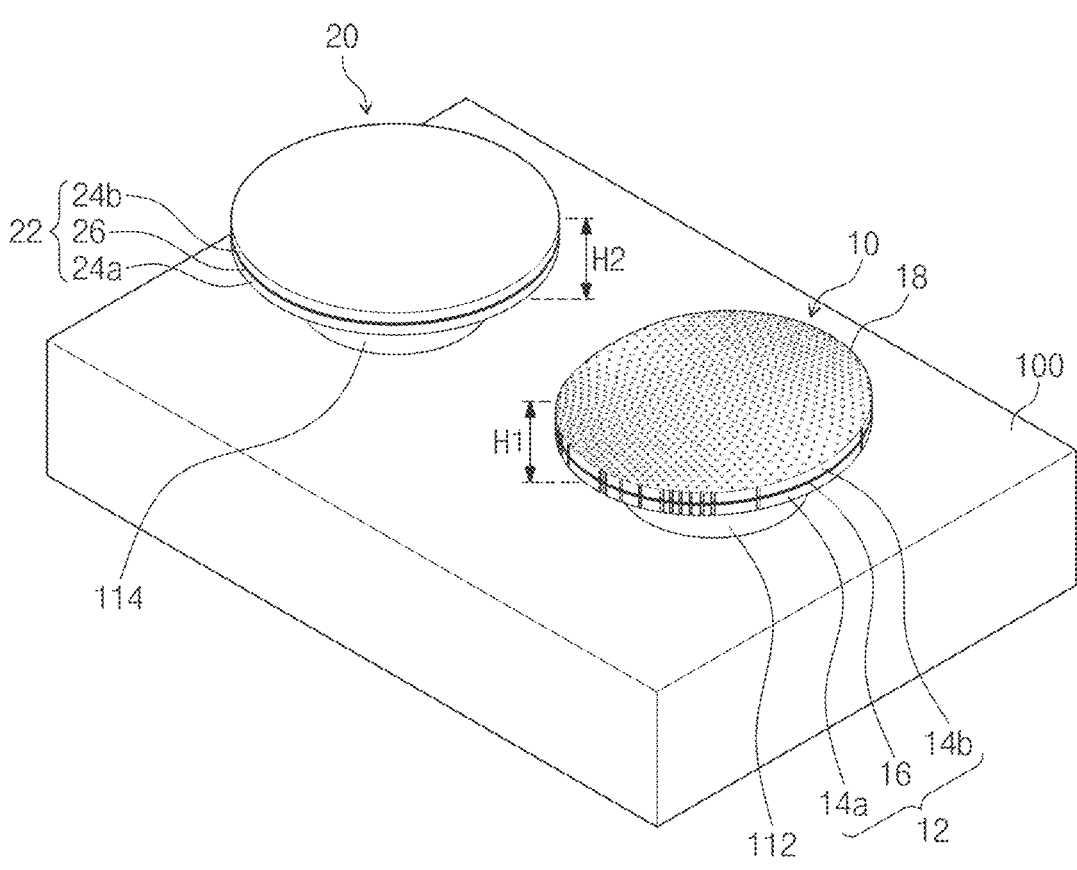

Referring to FIG. 5d, the first support part 112 may be formed under the first body 12 by etching the sacrificial layer 110. Similarly, the sacrificial layer 110 may be etched to form the second support part 114 under each of the second bodies 22. Due to the first support part 112 and the second support part 114, the first body 12 and the second body 22 may be spaced apart from the substrate 100, respectively. For example, the upper surface of the first body 12 may be spaced apart from the upper surface of the substrate 100 by a first distance H1, and the upper surface of the second body 22 may be spaced apart from the upper surface of the substrate 100 by a second distance H2. In this case, the first distance H1 and the second distance H2 may be equal to each other. Due to the first and second support parts 112 and 114, the amount of light trapped in the first laser diode 10 and the second laser diode 20 may be increased, respectively.

Then, referring again to FIG. 3a, the optical integrated device 1 may be manufactured by forming the optical waveguide 30 between the first laser diode 10 and the second laser diode 20.

The above description of the embodiments of the present invention provides examples for the description of the present invention. Therefore, the technical idea of the present invention is not limited to the above embodiments, and it is obvious that within the technical idea of the present invention, various modifications and changes may be made by a person having ordinary skill in the art by combining the above embodiments.

The invention claimed is:

1. An optical integrated device comprising:
a substrate;
a first laser diode oscillating in a transverse magnetic mode (TM mode) on the substrate; and
a second laser diode oscillating in a transverse electric mode (TE mode) on the substrate,
wherein the first laser diode comprises:
a first body in a shape of a disk; and
through holes penetrating the first body,
wherein the first body has a first portion and a remaining portion,
wherein a distance between the first portion and the second laser diode is less than a distance between the remaining portion and the second laser diode, and
wherein a curvature of the first portion is less than a curvature of the remaining portion such that the first body has a non-uniform curvature.

2. The optical integrated device of claim 1, wherein the second laser diode comprises a second body in a shape of a disk,
wherein a distance from an upper surface of the substrate to an upper surface of the first body is the same as a distance from the upper surface of the substrate to an upper surface of the second body.

3. The optical integrated device of claim 2, wherein each of the first body and the second body comprises:
an upper clad layer and a lower clad layer; and
a gain medium interposed between the upper clad layer and the lower clad layer.

4. The optical integrated device of claim 1, wherein an area ratio of the through holes per unit area of the first body is non-uniform.

5. The optical integrated device of claim 4, wherein a number of the through holes per unit area of the first body is non-uniform.

6. The optical integrated device of claim 4, wherein a diameter of the through holes per unit area of the first body is non-uniform.

7. The optical integrated device of claim 1, wherein at least a portion of the first body has a non-homogeneous refractive index.

8. The optical integrated device of claim 1, further comprising an optical waveguide on the substrate, the optical waveguide being between the first laser diode and the second laser diode.

9. The optical integrated device of claim 8, wherein the first body has the non-uniform curvature, and
wherein the first portion of the first body is adjacent to the optical waveguide such that the curvature of the first portion is less than a curvature of another portion of the first body spaced further apart from the optical waveguide.

10. The optical integrated device of claim 1, wherein a diameter of each of the through holes is less than a length of a wavelength of emitted light.

* * * * *